US005663992A

United States Patent [19]

Farmer

[11] Patent Number: 5,663,992
[45] Date of Patent: Sep. 2, 1997

[54] METHOD AND APPARATUS FOR CORRECTION OF GPS CARRIER PHASE MEASUREMENT

[75] Inventor: Dominic Gerard Farmer, Milpitas, Calif.

[73] Assignee: Trimble Navigation Limited, Sunnyvale, Calif.

[21] Appl. No.: 615,830

[22] Filed: Mar. 14, 1996

[51] Int. Cl.[6] ............................................. H03D 3/24
[52] U.S. Cl. ............................................. 375/376; 375/371
[58] Field of Search ............................. 375/376, 226, 375/371, 221

[56] References Cited

U.S. PATENT DOCUMENTS

| 4,563,657 | 1/1986 | Qureshi et al. | 331/25 |
|---|---|---|---|
| 4,791,488 | 12/1988 | Fukazawa et al. | 358/149 |
| 5,313,503 | 5/1994 | Jones et al. | 375/120 |
| 5,440,267 | 8/1995 | Tsuda et al. | 329/308 |
| 5,452,325 | 9/1995 | Brown et al. | 375/376 |
| 5,469,478 | 11/1995 | Lee | 375/376 |
| 5,486,792 | 1/1996 | Girardeau, Jr. | 331/10 |
| 5,537,442 | 7/1996 | Nakamura et al. | 375/330 |
| 5,566,204 | 10/1996 | Kardontchik et al. | 375/219 |

Primary Examiner—Stephen Chin
Assistant Examiner—Mohammad Ghayour
Attorney, Agent, or Firm—Blakely, Sokoloff, Taylor & Zafman

[57] ABSTRACT

The output phase measures output by a digital phase lock loop (DPLL) are selectively modified to reduce instantaneous phase errors incurred whilst waiting until the DPLL locks before obtaining an accurate phase measurement of a signal. In one embodiment, the output phase of a low bandwidth DPLL is selectively modified when the input signal exhibits a significant dynamic transient by adding the error term generated by the DPLL phase detector to the output signal generated by the DPLL to generate a modified output signal used to perform phase measurements.

15 Claims, 4 Drawing Sheets

METHOD AND APPARATUS FOR CORRECTION OF GPS CARRIER PHASE MEASUREMENT

BACKGROUND OF THE INVENTION

1. Field of the Invention

The present invention relates to the field of signal processing. More particularly, the present invention relates to the selective correction of Global Positioning System (GPS) carrier phase measurement data to improve output performance when operating in a high signal to noise ratio environment.

2. Art Background

Digital Phase Lock Loops (DPLL) are often used to lock the phase of an internal local signal to an input signal. In a high signal to noise ratio (SNR) environment a high bandwidth DPLL is desirable in order to quickly achieve lock. However, a high bandwidth DPLL does not perform well in a low SNR as the DPLL is not typically sensitive enough. Furthermore, high bandwidth DPLL dictates a higher loop closure sampling rate. This is a significant concern for those devices which implement a DPLL in software. The higher the sampling rate, the greater the system overhead. A low bandwidth DPLL, to the contrary, does not lock as quickly. However, the sampling rate can be lowered and a low bandwidth DPLL provides better sensitivity in low SNR environments.

In most devices utilizing a DPLL, the actual carrier phase measurement value is not important. However, in Global Positioning System (GPS) devices, such as GPS receivers, the actual carrier phase measurement itself is used to perform pseudorange determination which result in receiver location calculations. Further, any dynamic disturbance at the input to the DPLL, as might be occasioned by a sudden movement of the receiver antenna, will translate directly to an error in the pseudorange and thus in the indicated position fix. Restoring the static phase measurement as quickly as possible is important in such applications as surveying with a GPS device. Therefore, the speed at which the loop locks to the input is quite important. In addition, sensitivity at low SNR is also important as prior to achieving lock, the phase measurement value is not considered accurate. If, however, an accurate phase measurement value can be provided prior to achieving lock, then the speed at which the loop locks is not as important and a slower bandwidth DPLL can be used effectively in both low SNR and high SNR environments.

SUMMARY OF THE INVENTION

It is an object of the present invention to modify the carrier phase measure output by DPLL to provide an accurate phase measurement value prior to achieving lock in the DPLL.

In the system of the present invention, the output carrier phase measurement of the DPLL is selectively modified to reduce instantaneous phase errors incurred during the time the DPLL requires to achieve lock (i.e., while the DPLL tracks out a dynamic disturbance). More particularly, the carrier phase measurement of a low bandwidth DPLL is selectively modified when the input signal exhibits a high SNR by adding the error term generated by the DPLL phase detector to the output phase measurement generated by the DPLL to generate a modified output phase measurement value.

In one embodiment of the system of the present invention, the system includes a low bandwidth DPLL which generates an output signal from the input signal and also generates an error measure. A signal plus noise estimator is coupled to receive the input signal and generates a power measure indicative to the level of signal plus noise at the input. This power measure is compared to a threshold value indicative of a level of signal plus noise at which the output phase measure should be adjusted. When the threshold is exceeded, the output phase measure is adjusted to be the sum of the output signal generated by the DPLL and the error measure. Thus the system takes advantage of the positive aspects of a low bandwidth DPLL, e.g., better sensitivity to noise and lower system overhead, while providing a signal having a more accurate phase measure value prior to the DPLL achieving lock.

BRIEF DESCRIPTION OF THE DRAWINGS

The objects, features and advantages of the present invention will be apparent from the following detailed description in which.

DETAILED DESCRIPTION

The present invention provides for the selective correction of phase measurement output from a digital phase lock loop (DPLL). In the following description, numerous details are set forth in order to provide a thorough understanding of the present invention. However, it will be apparent to one skilled in the art that these specific details are not required in order to produce the present invention. In other instances, well known electrical structures and circuits are shown in block diagram form in order not to obscure the present invention unnecessarily.

The system and method of the present invention provides a selective technique which effectively alters the phase measurement bandwidth of a DPLL without altering the closed loop bandwidth of the DPLL. Thus the DPLL is implemented with a fixed sample rate and fixed loop filter coefficients while still providing variable measurement bandwidths. This is particularly beneficial for those systems, such as Global Positioning System (GFS) devices, which utilize a measure of the phase to perform certain functions or computations. Although the system of the present invention is described in the context of GPS device, it is not limited as such. Furthermore, this specification follows the nomenclature conventions described in a text entitled, Gardner, Floyd M., *Phaselock Techniques*, 2nd Ed John Wiley & Sons, 1979).

Figure 1:
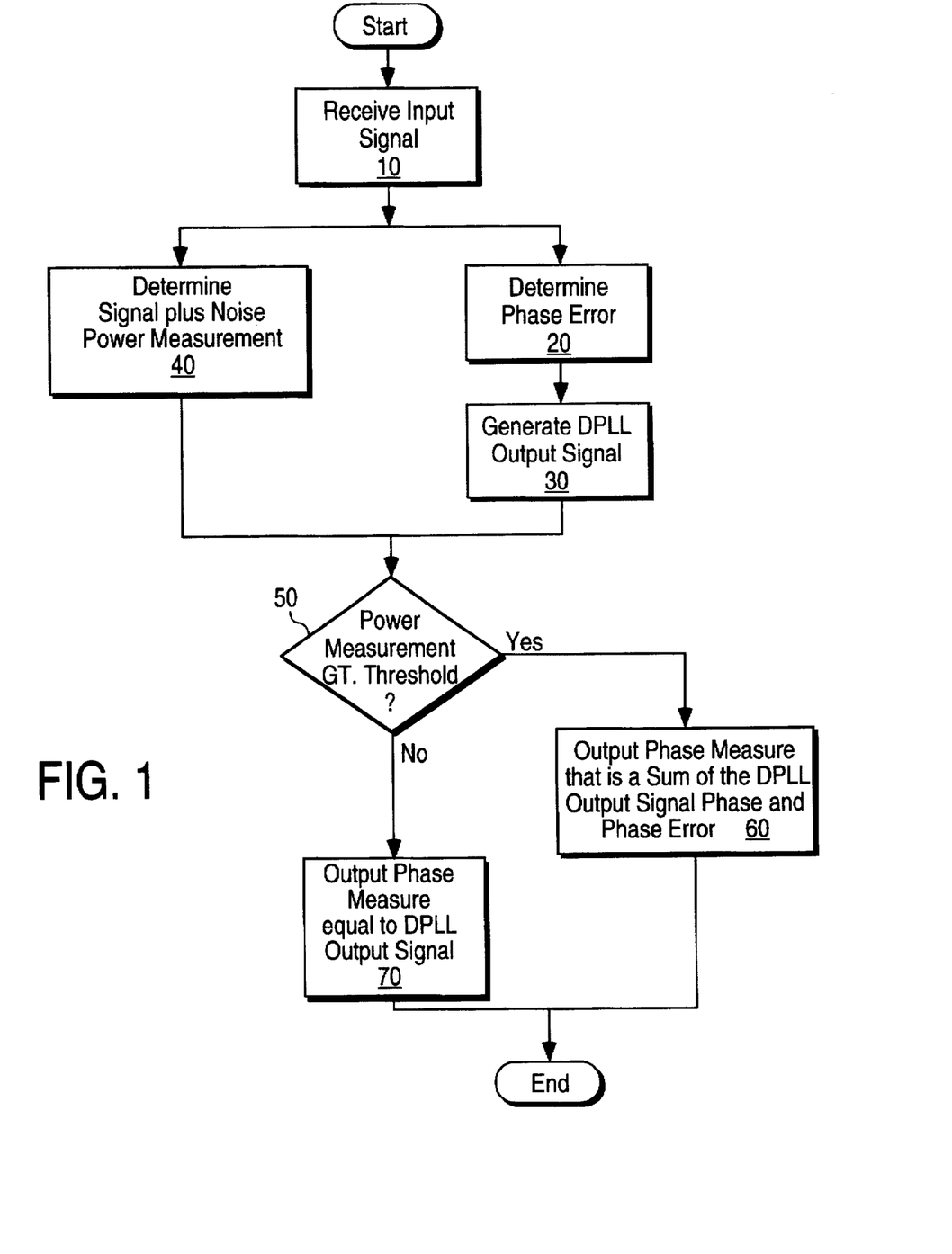
FIG. 1 is a flow diagram illustrating one embodiment of the method of the present invention.

FIG. 1 is a flow diagram illustrating one method of the method of the present invention. Referring to FIG. 1, the method implemented in the present invention is shown. An input signal is received, step 10. The input signal may be any signal that has the capacity to carry information. The input signal may be an RF signal, or it may be some other type of signal; it may be a digital signal, or it may be an analog signal. At step 20, the phase error between the input signal and an output signal generated by the DPLL is determined. The phase error is used to control the phase of the oscillator that generates the DPLL output signal, step 30. In the implementation of this method, steps 10, 20 and 30 are performed in a closed loop typical of prior art DPLL. By repetitively performing steps 10, 20 and 30, the DPLL will achieve a steady state (also referred to as achieving lock) at which the point the output signal is essentially locked to the phase of the input signal (such that the phase error is approximately zero). Once initial acquisition of lock is achieved, the DPLL will continue to operate and will perform lock following the occurrence of any dynamic event (e.g. when the phase difference ($\phi_e$) between the input signal and the output signal is greater than zero: abs ($\phi_e$)>>0).

In the method of the present invention, at step 40, the signal plus noise power measurement of the input signal is generated. Although the signal plus noise power measurement is utilized in the present embodiment as a measure of noise, it is contemplated that other measures of signal and noise, such as the signal to noise ratio, can be used to determine if the DPLL output signal should be adjusted in order to provide a more accurate phase measure prior to the DPLL achieving a lock. In the present embodiment, the signal plus noise power measurement is $A^2$, where the input signal consists of $A\sin(\phi_i)$ and $A\cos(\phi_i)$. An advantage to this measure is that the $A^2$ (Signal+Noise) detector is independent of phase error; i.e., it is unaffected by the DPLL output.

At step 50, a predetermined threshold level is compared to the signal plus noise power measurement. The threshold, or tolerance, is selected by the system implementer. For example the threshold may be based on an analysis of the relative disadvantages of noise, oscillations, delays and the DPLL characteristics and the purpose for which the phase measure is used. More particularly, the threshold is representative of a sufficiently high level of noise that therefore requires a relatively significant amount of time for the DPLL to achieve lock. For example, the quantization error associated with an analog to digital converter (ADC) used to convert an analog input signal to the input signal can be used as the threshold. However, other threshold values may also be determined, and may be calculated from time-varying conditions, as will be observed by one of ordinary skill in the art.

In the present embodiment, the error detector has a wider bandwidth and therefore has increased phase noise. The problem is to relate the signal plus noise measurement to a phase noise estimate. For a signal having an amplitude A, in-phase noise rms $\sigma_x$, and quadrature-noise rms $\sigma_y$:

$$\theta n = \arctan\left(\frac{\sigma_y}{A+\sigma_x}\right)$$

considering: $\sigma_y<<A$ and $\sigma_x<<A$, then $$\theta n \approx \frac{\sigma_y}{A} = \frac{1}{\sqrt{2SNR}} \text{ where } SNR = \frac{A^2}{2\sigma^2} \; ;$$

where $\theta n$ is the rms phase noise in radians.

The signal plus noise measure (P) is equal to:
$P=(A\cos(\phi)+\sigma_x)^2+(A\sin(\phi)+\sigma_y)^2$
$P=A^2\cos^2(\phi)+2A\sigma_x\cos(\phi)+\sigma_x^2+A^2\sin^2(\phi)+2A\sigma_y\sin(\phi)+\sigma_y^2$ If $A>>\sigma_x$ and $A>>\sigma_y$, then:
$P=A^2\cos^2(\phi)+A^2\sin^2(\phi)=A^2$ In the present embodiment, there is a fixed noise power at the phase measurement point. In some systems this is guaranteed by using automatic gain control (ACG). Other systems, such as 1 bit sampling schemes, have a closed loop fixed noise level. It is therefore valid to assume a constant noise rms $\sigma=\sigma_x=\sigma_y$.

Continuing with the above example, an estimate of SNR is $(A^2/2\sigma^2)$ and the SNR is related to error detector rms phase noise by the following:

$$(\theta n) = \frac{1}{\sqrt{2SNR}} = \left(\frac{\sigma}{A}\right) = \frac{\sigma}{\sqrt{P}} \; .$$

Therefore, a threshold of unacceptable/acceptable additional phase noise can be chosen. For example, assuming that a 5° phase noise rms is considered acceptable, the SNR at the detector input would have to be greater than $$\frac{1}{2}\left[\left(\frac{180}{\pi}\right)\frac{1}{5}\right]^2 = 65.6,$$

which translates to 18.2 dB.

In one embodiment, the phase detector input bandwidth is 100 Hz. Therefore, a C/No (noise ratio) GPS signal of $(18.2+20)=38.2$ $dBH_z$ or greater will have phase measurement error of 5° or less.

Alternately, a combination of the level threshold and the current error value ($\phi_e$) can be used:
if ((level>level threshold) AND (abs ($\phi_e$)>phase threshold)) then add in $\phi_e$.

This process is advantageous because if the loop is locked, i.e., the phase error ($\phi_e$) is close to 0, then the noise penalty caused by adding in the error measurement is not included as the phase error is not greater than the phase threshold. However, if a dynamic event occurs, the abs ($\phi_e$) value will exceed the phase threshold and an instant wide band correction occurs. This is ideal for the kinematic receiver environment, as a user typically is not performing high dynamic motion for the majority of the time.

If the power measurement is greater than the phase threshold, it is desirable that the DPLL output signal be adjusted to provide a more accurate phase measure prior to the DPLL achieving lock. In the present embodiment, the phase measure used to perform subsequent phase measurements is the sum of the phase error and the phase of the DPLL output signal, step 60. If the power measurement does not exceed the threshold, the phase measure is determined from the unaltered DPLL output signal, step 70. It should be noted at this time that phase measure is adjusted independent of the values utilized in the DPLL; the DPLL output signal continues to be input through a feedback loop of the DPLL in order to achieve lock.

Figure 2:
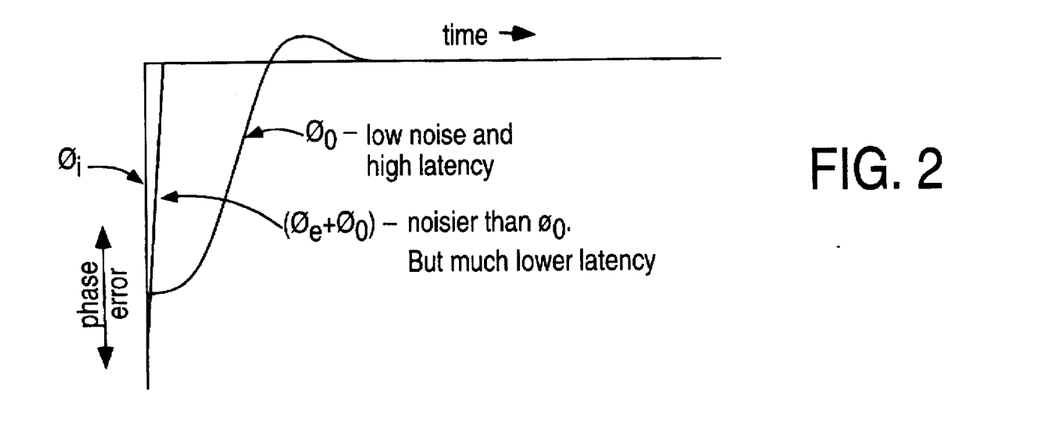
FIG. 2 illustrates the effectiveness of the method and apparatus of the present invention.

Thus, a simple, but effective mechanism is provided to allow more accurate phase measurements prior to a DPLL achieving lock. The advantages are numerous, including the ability to consistently use a low bandwidth DPLL without the need to modify the loop parameters or sampling rate for a noisy signal. FIG. 2 illustrates the effectiveness of the method and apparatus of the present invention on the phase measure. In the GPS application, the phase error translates directly to errors in the position solution. Thus, for example, any rapid movement in the antenna of the receiver causes an instantaneous error in the position calculation. By using the method described herein, the output phase measure used provides a rapid accurate output phase measure prior to the DPLL achieving lock after dynamic transients, such as antenna movement mentioned above, occur.

Figure 3:
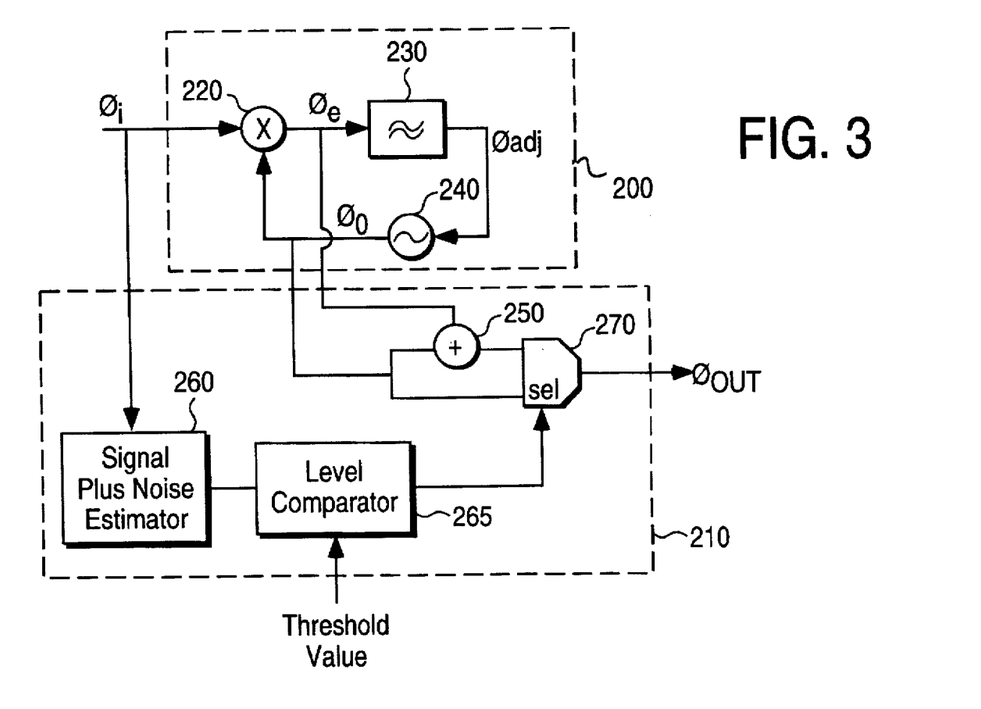
FIG. 3 is a simplified block diagram illustrating one implementation of the system of the present invention.

FIG. 3 is illustrative of one embodiment of the system of the present invention. The system may be implemented using hardware, firmware, software or a combination of the three. Preferably, the system is implemented using a combination of hardware and software. For example, most of the elements can be implemented in hardware, except for portions of phase error determination device 220 and element 230.

FIG. 3 is a simplified block diagram of one embodiment of the system of the present invention. The system is described in the context of two portions 200, 210. Portion 200 is the DPLL and portion 210 is the adjustment circuit. It is contemplated that any prior art DPLL can be used for portion 200. As is well known in the art, the bandwidth of the DPLL can be configured to be appropriate for the type of signal typically processed. More particularly, it is advantageous to use a high bandwidth DPLL in a less noisy signal environment (because it will lock faster) and a low bandwidth DPLL in a more noisy environment (because the DPLL is more sensitive). In the system of the present invention, a low bandwidth DPLL is preferred.

For a code correlating GPS receiver, the typical received signal C/No is in the range of 30 dBHz to 55 dBHz. Given the signal range, acceptable loop bandwidths might extend from 10 Hz to 100 Hz. A further constraint is the implementation sampling rate or loop closure rate. However, a 50 Hz loop sampling rate plus some computational latency might limit the usable range of loop bandwidth to 10–20 Hz.

In the present embodiment, DPLL 200 includes a phase error determination device 220 which, in the present embodiment, determines the phase error ($\phi_e$) to be the phase difference between the input signal ($\phi_i$) and the output signal ($\phi_o$) of the DPLL. Although FIG. 3 represents phase error determination device 220 as a mixer, other devices that perform comparable functions can be used. See, for example, Gardner, Floyd M., *Phaselock Techniques*, 2nd Ed (John Wiley & Sons, 1979), pp. 117–125.

The phase error is used to adjust the phase of oscillator 240 which generates the DPLL output signal ($\phi_o$). In the present embodiment, element 230 referenced herein as the "loop filter", generates an adjustment control signal ($\phi_{adj}$) to the oscillator based upon the phase error ($\phi_e$). It is readily apparent that, depending upon the configuration of the DPLL, element 230 can take on many forms. Although ($\phi_o$) is input back to phase error determination device 220 in order that the DPLL 200 perform the necessary iterations to achieve lock, the ($\phi_o$) signal is selectively adjusted prior to output to other portions of the system (not shown) that processes the signal. For example, in a GPS receiver, the subsequent portions include circuitry to measure the carrier phase of the received signal in order to determine location information.

To selectively adjust the phase output, portion 210 includes a signal plus noise estimator 260, level comparator 265, adder 250 and selector 270. Signal plus noise estimator 260 provides an estimate of the amount of signal plus noise in the circuit. Preferably a computation of power of the signal including noise is performed. This computation provides an effective, but low overhead method for estimating the amount of signal and noise present. As is readily apparent, other noise measurements/computations can be used.

The level comparator 265 compares the power signal to the threshold value and issues a select signal to select the output phase measure based upon the comparison. Preferably, the threshold value utilized is indicative of a signal level that would cause the low bandwidth DPLL used in the present embodiment to require a relatively long period of time to achieve lock. In such an instance, it is therefore desirable to provide a phase value ($\phi_{out}$) that is somewhat more accurate than ($\phi_o$).

In the present embodiment, the phase output phase measure ($\phi_{out}$) is the sum or the DPLL phase output ($\phi_o$) and the phase error ($\phi_e$) computed by the DPLL. It is readily apparent that other techniques can be used to compute ($\phi_{out}$). Therefore, in the present embodiment, ($\phi_o$) and ($\phi_e$) are input to adder 250 which sums the two phase values. The output of adder 250 is input to selector 270. Selector 270 also receives as input the output signal ($\phi_o$) and the select signal generated by the noise level comparator 265, and outputs ($\phi_{out}$) or ($\phi_o$) depending upon the select signal.

Figure 4:
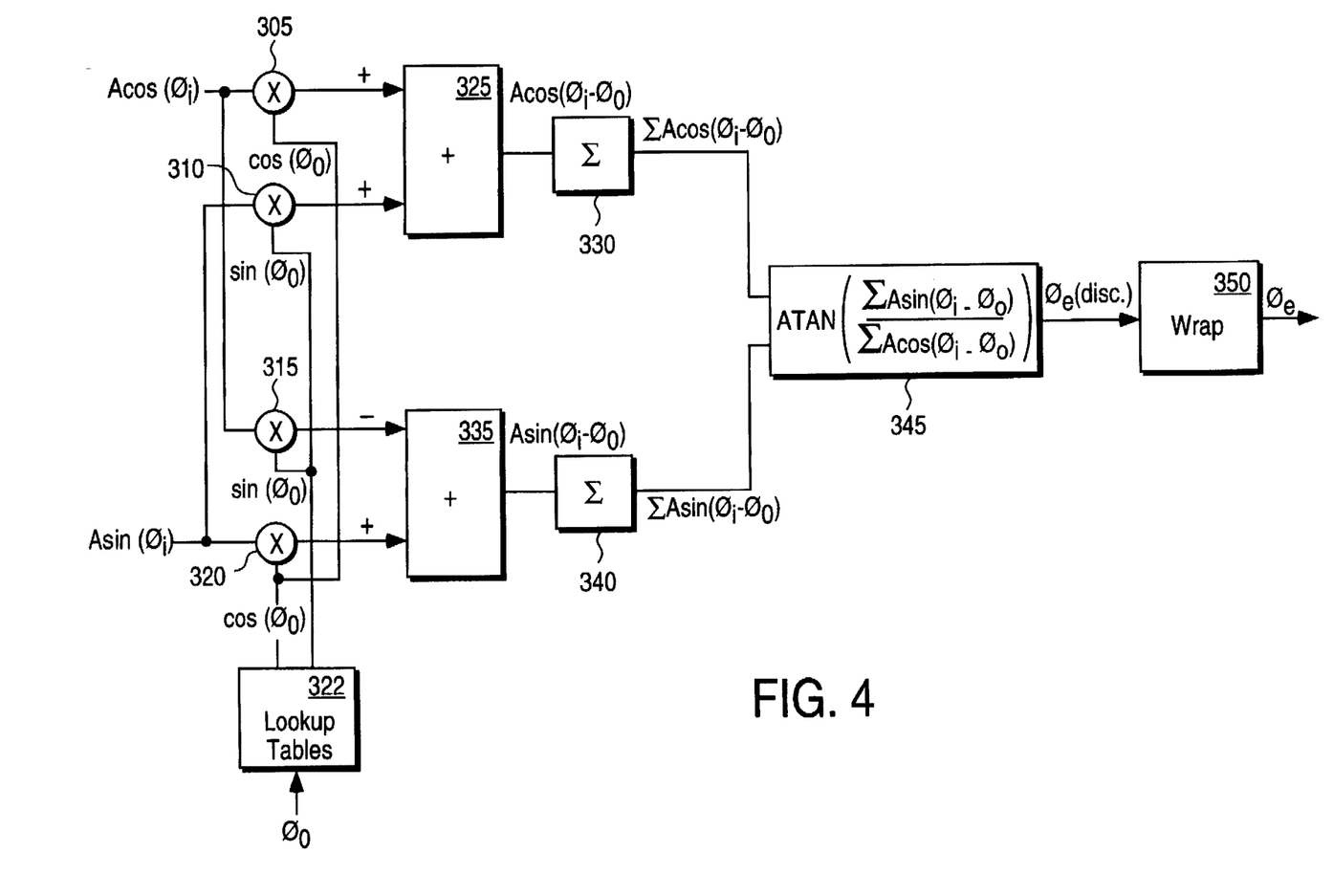
FIG. 4 is a block diagram illustrating one embodiment of the phase error detection block of the system implementation of FIG. 3.

FIG. 4 is block diagram illustrating one embodiment of the phase error detection block of the system implementation of FIG. 3. The embodiment described is a complex multiplier or phase rotator that performs the function [$e^{j\phi i} \cdot e^{-j\phi o}$] to generate $\phi_e$:

$$e^{j\phi i}e^{-j\phi o} = (\cos(\phi_i) + j\sin(\phi_i))(\cos(\phi_o) - j\sin(\phi_o))$$

$$= (\cos(\phi_i)\cos(\phi_o) + \sin(\phi_i)\sin(\phi_o)) + j(\sin(\phi_i)\cos(\phi_o) - \cos(\phi_i)\sin(\phi_o))$$

$$= \cos(\phi_i - \phi_o) + j\sin(\phi_i - \phi_o).$$

In the present embodiment, the input signal consists of two portions, $A\cos(\phi_i)$ and $A\sin(\phi_i)$. Mixers 305, 310, 315, 320 are used to mix the input signal with the DPLL output signal ($\phi_o$). The DPLL output signal ($\phi_o$) is first input to a lookup table 322 which performs a lookup based upon the ($\phi_o$) value and outputs corresponding $\sin(\phi_o)$ and $\cos(\phi_o)$ values to mixers 305, 320 and 310, 315, respectively. The outputs of mixers 305 and 310 are input to adder 325 and integrator 330 which sums the inputs to generate [$\cos(\phi_i)\cos(\phi_o) + \sin(\phi_i)\sin(\phi_o)$] = $\Sigma A\cos(\phi_i - \phi_o)$. Similarly, the outputs of mixers 315 and 320 are input to adder 335 and integrator 340 which sums the inputs to generate $A(\sin(\phi_i)\cos(\phi_o) - \cos(\phi_i)\sin(\phi_o)) = \Sigma A\sin(\phi_i - \phi_o)$. These values are input to arctangent function 345 which performs the function ATAN [($\Sigma A\sin(\phi_i - \phi_o))/A\cos(\phi_i - \phi_o)$)] which is equal to ($\phi_e$) (discontinuous). However, the ($\phi_e$) (discontinuous) value is discontinuous. Therefore a wrap function 350 is provided to recognize when a wraparound occurs (e.g., the phase error exceeds 90°) and modifies the ($\phi_e$) value to reflect any wraparound. This is achieved by counting the number of 90° increments between $\phi_i$ and $\phi_o$. In the present embodiment, the points of discontinuity occur at (90+r*180) when {r=−. . . −2, −1, 0, 1, 2 . . . }. To detect a wrap condition, the last phase is compared to the current phase. The absolute magnitude of the difference between the two is then examined: abs ($\phi_{en} - \phi_{en-1}$). If this phase difference exceeds 90 degrees, the current phase value is corrected by a 180 degree delta to remove the discontinuity. For example, looking at four points A, B, C, D, the points have arctangent values (i.e. measurements from the phase detector) of A=40°, B=60°, C=80°, D=−80. The phase differences are therefore: (B−A) =20°, (C−D)=20°, (D−C)=−160°. As abs(D−C) exceeds 90°, the new phase D is adjusted by adding back the 180° discontinuity (−80)+(180)=100° and an updated phase error ($\phi_e$) is generated.

Although the circuit can be implemented in hardware, software, firmware or a combination, it is preferred that the complex mixer and oscillator portions of the circuit are implemented primarily in hardware, with the arctangent function 345 and wrap function 350 implemented in software.

Figure 5:
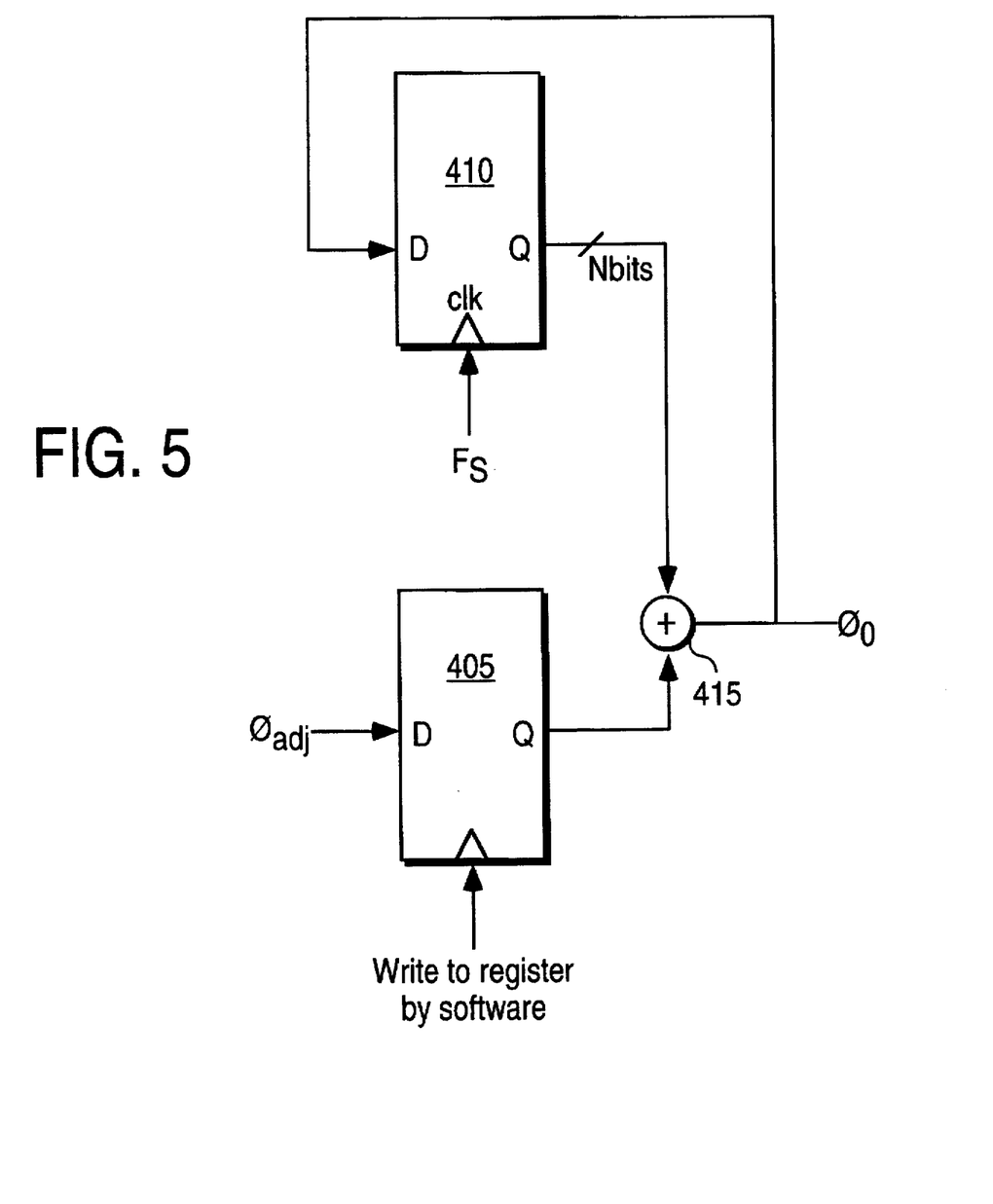
FIG. 5 is a block diagram of one embodiment of an oscillator utilized in the system implementation of FIG. 3.

One implementation of the oscillator 240 (FIG. 3) is described in FIG. 5. Referring to FIG. 5, the filtered phase error (øadj) is used to control the stepsize of an integrator circuit implemented by multiple bit D flip flop 405, multiple bit D flip flop 410 and adder 415. D flip flop 405 provides the count delta (øadj) to be added to the current count ($ø_{On-1}$), output by D flip flop 410. Preferably, D flip flop 405 appears as a hardware register to which the output of the filter ($ø_{adj}$) is written to. Thus, at every clock sample, Fs, a software controlled value ($ø_{adj}$), is added to the current phase value, $ø_{on-1}$. The rate of change of $ø_o$ is set by Fs and k (k is basically a frequency control). The circuit has a fixed range of values that extend from 0 to $2^{N-1}$ (since there are only N bits). Therefore, $ø_o$ is scaled so that 0=0° and $2^N$=360°. Thus, the oscillator circuit copies the discontinuous nature of the phase functions. The output frequency equals the rollover rate which is equal to $$\frac{\phi_{adj} F_s}{2^N},$$

where $F_s$ is the sampling frequency and N is the number of bits.

The invention has been described in conjunction with the preferred embodiment. It is evident that numerous alternatives, modifications, variations and uses will be apparent to one skilled in the art in light of the foregoing description.

What is claimed is:

1. An apparatus for selective correction of a phase measurement comprising:

a digital phase lock loop (DPLL) coupled to receive an input signal, said DPLL determining the phase error between the input signal and a DPLL output signal and adjusting the DPLL output signal in accordance with the phase error;

a signal plus noise measurement device coupled to receive the input signal, said signal and noise measurement device generating a signal plus noise level measure of the input signal;

a comparator to compare the signal and noise level measure to a threshold value indicative of a need to correct a phase of the DPLL output signal prior to output from the apparatus as an output signal, said comparator generating a control signal to indicate whether to correct the phase of the DPLL output signal if the signal and noise level measure is in excess of the threshold value;

an adder circuit coupled to receive the phase error and the DPLL output signal, said adder circuit adding the phase error to the phase of the DPLL output signal; and a select subcircuit coupled to receive the DPLL output signal, the output of the adder circuit, and the control signal, said control signal indicating to output as the output of the apparatus the output of the adder circuit ff the noise measure is in excess of the threshold value, and the DPLL output signal if the noise measure is not in excess of the threshold value.

2. The apparatus as set forth in claim 1, wherein the DPLL operates using fixed sample rate and fixed DPLL coefficients.

3. The apparatus as set forth in claim 1, wherein the DPLL operates at a low bandwidth to provide noise sensitivity in a low signal to noise ratio (SNR) environment.

4. The apparatus as set forth in claim 1, wherein the input signal comprises $A\sin(ø_i)$ and $A\cos(ø_i)$ and the signal and noise power measurement comprises $A^2$.

5. The apparatus as set forth in claim 1, wherein the threshold value comprises a quantization error associated with an analog to digital converter (ADC) used to convert an analog input signal to the input signal.

6. The apparatus as set forth in claim 1, wherein the DPLL comprises a phase error measurement device comprising:

a complex multiplier that generates an output $\Sigma A\sin(ø_i-ø_o)$, $\Sigma A\cos(ø_i-ø_o)$ based on inputs $\sin(ø_o)$, $\cos(ø_o)$, $\sin(ø_i)$, $\cos(ø_i)$, wherein $ø_o$ is the phase of the DPLL output signal, $ø_i$ is the phase of the input signal and $ø_e$ is the phase error;

an arctangent function that performs the following function; ATAN [($A\sin(ø_i-ø_o)/A\cos(ø_i-ø_o)$)] to generate $ø_e$(disc), where ATAN is an arctangent function and $ø_e$(disc) represents a discontinuous form of the phase error between the input signal and the DPLL output signal;

a wrap function that determines the number of 180° increments/decrements inclusive in the phase error between the input signal and the DPLL output signal and adjusting $ø_e$(disc) to reflect the number of increments/decrements to produce $ø_e$, where $ø_e$ represents the phase error.

7. The apparatus as set forth in claim 7, wherein the inputs $\sin(ø_o)$, $\cos(ø_o)$ are generated by a lookup table based on a value of $ø_o$ input to the lookup table.

8. The apparatus as set forth in claim 1, wherein the DPLL comprises an oscillator that generates the DPLL output signal with the phase adjusted in accordance with the phase error.

9. A method for selective correction of a phase measurement comprising the steps of:

receiving an input signal;

determining a phase error between the input signal and a loop output signal;

adjusting a phase of the loop output signal in accordance with the phase error;

determining a signal plus noise level measure from the input signal;

comparing the signal plus noise level measure to a threshold value indicative that the input signal is sufficiently noisey to adjust the phase of a device output signal;

if the signal plus noise level measure exceeds the threshold value, providing the sum of the phase error and the phase of the loop output signal as the device output signal; and if the signal plus noise level measure does not exceed the threshold value, providing the loop output signal as the device output signal.

10. The method as set forth in claim 9, wherein the step of determining the phase error comprises the steps of:

performing a complex multiplication that generates an output $A\sin(ø_e)$, $A\cos(ø_e)$ based on inputs $\sin(ø_o)$, $\cos(ø_o)$, $\sin(ø_i)$, $\cos(ø_i)$, wherein $ø_o$ is the phase of the loop output signal, $ø_i$ is the phase of the input signal and $ø_e$ is the phase error;

computing ATAN($\Sigma A\sin(ø_i-ø_o)/\Sigma A\cos(ø_i-ø_o)$) to generate $ø_e$(disc), where ATAN is an arctangent function and $ø_e$(disc) represents a discontinuous form of the phase error between the input signal and the loop output signal;

determining the number of 180° increments inclusive in the phase error between the input signal and the loop output signal and adjusting $ø_e$(disc) to reflect the number of increments or decrements to produce $ø_e$, where $ø_e$ represents the phase error.

11. The method as set forth in claim 10, wherein the input signal comprises $A\sin(ø_i)$ and $A\cos(ø_i)$ and the signal and noise power measurement comprises $A^2$.

12. The method as set forth in claim 9, wherein the threshold value comprises a quantization error associated with an analog to digital converter (ADC) used to convert an analog input signal to the input signal.

13. A method for selective correction of a phase measurement generated by a digital phase lock loop (DPLL), said DPLL determining a phase error and modifying a loop output signal in accordance with the phase measure, said method comprising the steps of:

determining a signal plus noise level measure from a loop output signal of the DPLL;

comparing the signal plus noise level measure to a threshold value indicating that the input signal is sufficiently noisy to adjust the phase of the loop output signal to be an output phase measure for subsequent processing independent of the DPLL;

if the signal plus noise level measure exceeds the threshold value, providing the sum of the phase error and the phase of the loop output signal as the output phase measure; and if the signal plus noise level measure does not exceed the threshold value, providing the phase of the loop output signal as the output phase measure.

14. The method as set forth in claim 13, wherein the signal plus noise level measure is a signal plus noise power measurement.

15. The method as set forth in claim 14, wherein the signal plus noise measurement is equal to $A^2$, where A is a DPLL input signal amplitude.

* * * * *

UNITED STATES PATENT AND TRADEMARK OFFICE
CERTIFICATE OF CORRECTION

| | | |
|---|---|---|
| PATENT NO. | : | 5,663,992 |
| DATED | : | September 2, 1997 |
| INVENTOR(S) | : | Dominic G. Farmer |

It is certified that error appears in the above-identified patent and that said Letters Patent is hereby corrected as shown below:

In column 7 at line 54 delete "ff" and insert --if--

Signed and Sealed this

Sixteenth Day of December, 1997

Attest:

BRUCE LEHMAN

Attesting Officer

Commissioner of Patents and Trademarks